United States Patent [19]

Shakley

[11] Patent Number: 4,781,205

[45] Date of Patent: Nov. 1, 1988

[54] PRODUCT GUIDE FOR PROCESSING EQUIPMENT

[75] Inventor: Conrad D. Shakley, Spring Mills, Pa.

[73] Assignee: Chemcut Corporation, State College, Pa.

[21] Appl. No.: 54,510

[22] Filed: May 27, 1987

[51] Int. Cl.⁴ ............................................. B08B 3/00
[52] U.S. Cl. ................................ 134/131; 198/780; 34/236; 271/275
[58] Field of Search ............... 198/780, 722; 134/124, 134/128, 131; 34/236, 148; 271/264, 274, 275; 226/196

[56] References Cited

U.S. PATENT DOCUMENTS

| | | | |
|---|---|---|---|
| 3,082,774 | 3/1963 | Benton et al. | 198/780 X |
| 3,431,921 | 3/1969 | Pesek | 134/131 X |
| 3,776,800 | 12/1973 | Goffredo et al. | 156/345 |
| 3,801,387 | 4/1974 | Goffredo et al. | 134/198 X |
| 3,810,787 | 5/1974 | Yoeli et al. | 134/198 X |
| 3,848,752 | 11/1974 | Branch et al. | 198/780 X |
| 3,935,041 | 1/1976 | Goffredo et al. | 156/666 X |
| 4,015,706 | 4/1977 | Goffredo et al. | 198/860.3 X |
| 4,017,982 | 4/1977 | Goffredo | 34/148 X |

FOREIGN PATENT DOCUMENTS 2851510 11/1978 Fed. Rep. of Germany .

OTHER PUBLICATIONS

Adam Pill Blatt 16 (attached).

Primary Examiner—Robert J. Spar
Assistant Examiner—Cheryl L. Gastineau
Attorney, Agent, or Firm—Paul & Paul

[57] ABSTRACT

Guide elements are provided to be mounted on rotatable drive rods of a conveyor apparatus, preferably of the type for wet processing of thin electrical printed circuit boards or printed circuit film, as the same is subjected to acid, neutralizer, water, air, sprays, rinses or the like, as such thin materials are moved through the machine. The guides serve to keep the thin materials from falling out of their intended planar path of travel through the machine, but are readily removable, preferably in snap-on, snap-off fashion for ready conversion of the apparatus to handle thicker materials in which such guide elements are not needed. The guide elements may be mounted in staggered fashion across the apparatus and serially along the path of travel through the apparatus. The elements are configured to resist twisting and allow rotatable drive rods to continue to rotate while the elements are disposed on the drive rods, but without rotation of the guide elements.

7 Claims, 1 Drawing Sheet

PRODUCT GUIDE FOR PROCESSING EQUIPMENT

BACKGROUND OF THE INVENTION

The present invention is directed to the conveyance of small and/or thin materials through an apparatus, in which the materials are being processed, and more specifically to the conveyance of thin printed circuit boards or printed circuit film through a wet processing apparatus in which the thin materials may be subjected to sprays of etchants, rinse, drying air, neutralizer solutions or the like.

Without intending to be limiting, some examples of processing equipment with respect to which the present invention is adapted, are equipment of the type disclosed in U.S. Pat. Nos. 4,015,706, 3,935,041, 3,905,827, 3,801,387 and 3,776,800, the disclosures of which are herein incorporated by reference.

The above-mentioned and other types of equipment, particularly in the wet processing art, have often come to employ rotatable drive rods extending transverse of the machine, having wheels or disks mounted on the drive rods, such that when the drive rods are driven, generally from an end thereof, the wheels rotate and engage and define a path of travel for printed circuit boards or other materials that are to be treated, as they pass through the apparatus from one end to the other. Some such apparatus is designed in the form of modular units, each adapted for perhaps a single treatment, such as a spraying treatment, with another adapted for rinsing treatment, another adapted for a drying treatment, etc. Other apparatus is of the built-up type wherein a single piece of equipment may have many processing functions therein.

In the processing of materials, particularly in the processing of materials for use in the electronics industry, its has become more commonplace than rather than using rigid or semi-rigid printed boards, the "boards" have become increasingly thinner, to the extent that such materials approach or become more of a flexible "film". Indeed, in the art it has been known that circuits are constructed of thin flexible films that may then be used in various configurations, not limited to flat or planar configurations, such as in the nosecones of rockets and the like.

Accordingly, as such materials requiring treatment have become thinner and thinner, or otherwise smaller and smaller, conventional guiding techniques have not always been successful, in that, in the case of films, the films have often tended to buckle and become jammed against drive rods in movement along their path, often helped in such buckling by the weight of etchants, sprays, or the like; in some cases, the films have dropped between adjacent rotatable rods, resulting in disruption of the treatment process.

THE PRIOR ART

The prior art has developed such that such thin films have been assisted, from time to time, by employing a plurality of thin guide wires running from one end of the apparatus to the other, often reasonably closely spaced in parallel configuration, such that a thin film can never depart significantly below the desired path of travel for it through the apparatus. Such wires have run from one end to the other of the apparatus, with many such wires being disposed parallel to each other.

The present invention is directed to the recognition of and solving of a problem; namely, that of maintaining flexibility in the equipment so that is not dedicated to handling either thicker materials such as printed circuit boards, or thin materials such as printed circuit film, but wherein the equipment may be readily adaptable for handling one or the other.

To this end, the present invention teaches the use of guide elements that may readily be mounted or demounted on drive rods, depending upon whether thin materials requiring the use of supplemental guides of any type are necessary or not.

SUMMARY OF THE INVENTION

The present invention is directed toward providing guiding means for thin materials being conveyed through processing equipment, in which the guiding means are adapted for mounting and removal relative to drive rods on which they are carried, without requiring demounting of the drive rods themselves.

It is a primary object of the present invention to provide readily mounted and demounted guide elements, for drive rods of processing equipment.

It is another object of the present invention to accomplish the above object, wherein the guide elements are provided with rails located generally in the plane of travel of materials through the apparatus.

It is a further object of this invention to accomplish the above objects, wherein the guide elements are provided with a snap-on, snap-off connection to the drive rods, with at least one such connection to a drive rod for each said element.

It is a further object of the present invention to accomplish each of the above objects, wherein the guide elements readily permit rotational movement of drive rods therein.

It is still a further object of the present invention to accomplish each of the above objects, wherein the guide elements themselves permit corners of film or the like being guided to pass therealong and therebeneath free of obtrusive engagement with the elements themselves, particularly at downstream ends of the elements.

It is a further object of the present invention to accomplish each of the above objects, wherein the elements include a stabilizer for protecting the elements against twisting during use.

Other objects and advantages of the present invention will be readily apparent to those skilled in the art from a reading of the following brief descriptions of the drawing figures, the detailed description of the preferred embodiment, and the appended claims.

BRIEF DESCRIPTIONS OF THE DRAWING FIGURES

In the drawings

FIG. 1 is a longitudinal sectional view, partially schematic, taken through a spraying apparatus in accordance with this invention, in which guide elements are disposed over drive rods of the apparatus, above and below spray heads for spraying etchants, rinsing fluid or the like thereon, as thin material being treated is moved from an upstream to a downstream direction in the direction of the arrow indicated.

DETAILED DESCRIPTION OF THE PREFERRED EMBODIMENT

Figure 1:
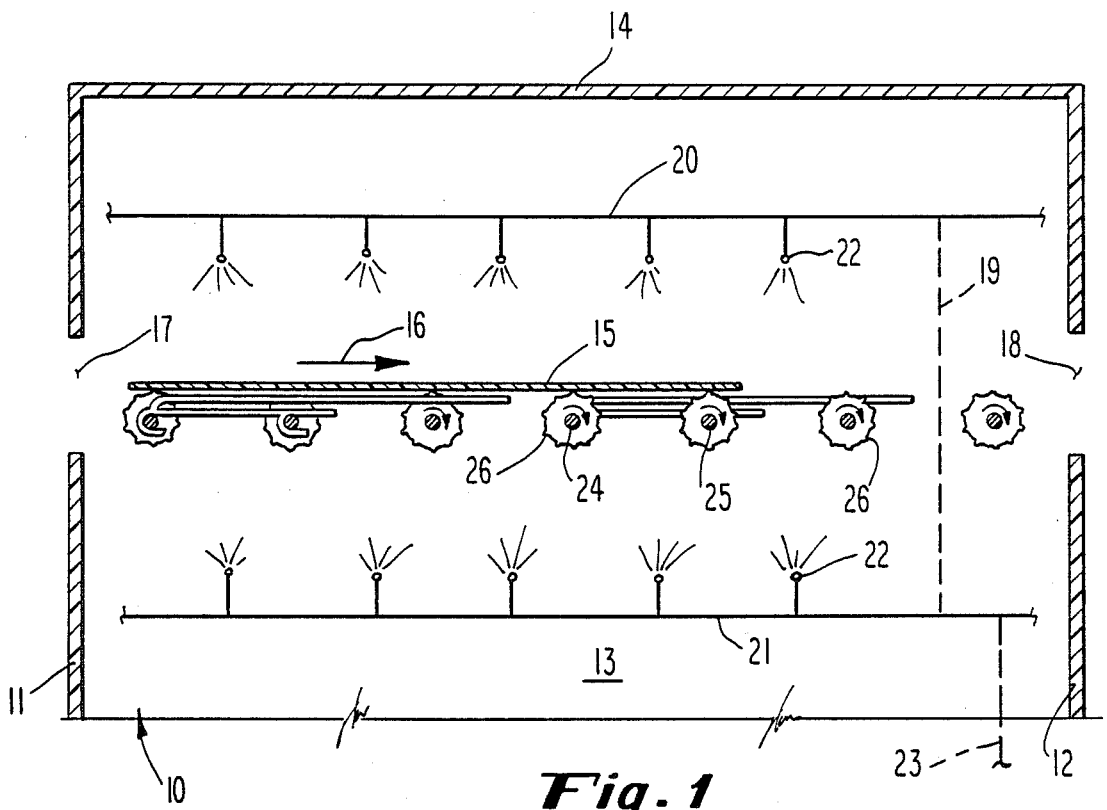

Referring now to the drawings in detail, reference is first made to FIG. 1, wherein the apparatus of this invention is generally designated by the numeral 10, as comparing inlet end wall 11, outlet end wall 12, opposed side walls 13, an upper chamber wall 14, and a chamber floor (not shown in view of the foreshortening of the illustration).

Articles being treated such as printed circuit film 15 are conveyed through the apparatus 10 from an upstream end thereof commencing at the inlet opening 17, and pass in the direction of arrow 16 to a downstream end that terminates at the outlet 18.

As the articles 15 are being thus conveyed, an etchant, rinse or the like is delivered thereto from suitable spray headers 20 and 21, supplied by suitable supply lines, such as 19, 23 or the like, from any suitable fluid supply source (not shown), with the fluid thus being supplied from the headers 20,21 by means of suitable sprays 22, to impart the desired treatment fluid to upper and lower surfaces of the articles 15 that are to be treated.

A plurality of generally parallel and transversely oriented drive rods such as 24,25 or the like, extend transversely of the apparatus between side walls 13 thereof, and outside one side wall are generally driven in unison by means not shown, but which is disclosed in the above-mentioned referenced patents. The drive rods have generally smooth or surface-serrated drive wheels 26 disposed thereon, such that the rotation of the rods in the direction shown in FIG. 1 will drive the wheels 26 in the direction shown. The wheels 26 are generally of an etchant-resistant synthetic rubber-like material, and in the aggregate define a plane that is a path of travel for articles 15 through the apparatus in the direction of arrow 16. The wheels 26 are generally disposed, many in number, along each of the rods 24,25, in staggered relation, across the apparatus.

Thus, it is seen that etchant or other substance may lay on the upper surface of the material 15, and in the case where such material 15 is extremely thin, it may be caused to drop into the opening between adjacent rods 24,25 and the wheels 26 carried thereon. Alternatively, simply the force provided by the spraying action from nozzles 22 or the like, or drying air or the like, may cause the material 15, if it is sufficiently thin, to depart from the desired path of travel through the apparatus, to become obstructed by one or more wheels or associated drive rods of the like, or otherwise to become interfered with in the path of travel of the thin material 15 through the apparatus.

Figure 2:
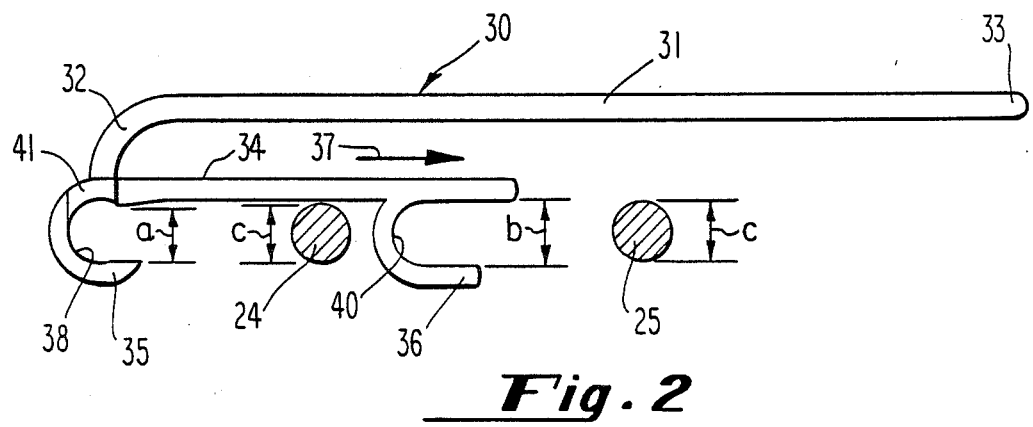
FIG. 2 is a side elevational view of a guide element in accordance with this invention, shown with its U-shaped openings disposed facing a pair of drive rods about which it is adapted to be mounted.
Figure 3:
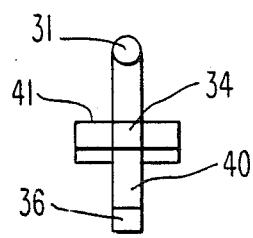
FIG. 3 is an end elevational view of the guide element of FIG. 2, taken generally from the right end of FIG. 2.

To this end, a plurality of drive elements 30 are provided, preferably constructed as illustrated in FIGS. 2 and 3. The elements 30 are generally of one-piece molded plastic or like construction such as will be resistant to etching, rinsing, fluids or the like, and comprise an upper guide rail 31, that is connected by means of an arcuate connection 32 at its left-most end (the end that would normally first see thin material to be passed thereover), and to be unconnected at its right-most end 33, to the rest of the element. The arcuate connection 32 is attached to the rest of the element, generally at the left-most end of a lower longitudinal rail 34. The rail 34 is slightly longer than the distance between two adjacent rods 24,25, and is provided with two U-shaped rightwardly opening guide mounts 35,36, for mounting respectively over rods 24,25, as the element is moved rightwardly, in the direction of the arrow 37. In such movement, the mounting portion 35, which has a throat or opening of a dimension "a" will snap-over the slightly larger dimensioned "c" rod 24, such that the element 30 has to be snapped-off, at such time as removal of the element 30 is desired from the rods. Thus, it will be seen that the rod 24 is snuggly received within the opening 38. At the same time, the rod 25 is slidingly received within the opening 40, which is preferably a slightly larger opening size "b" than the exterior dimension "c" of the rod 25, but that such arrangement permits ready removal of the mount 36 from the rod 25, but in use prevents rotation of the element 30 with the rod 24, in that it confines the upward or downward movement of the element 30. While the mount 35 snaps onto the rod 24, it will be understood that the rod 24 is free to rotatably slide against surface 38 during its driving rotation of the wheels 26 for conveyance of material 15 through the apparatus 10.

A stabilizing bar 41 is comprised of integral projections extending from each side of the rail 34, as is best seen in FIG. III, and has an interior surface that merges with the arcuate surface 38, as indicated in FIG. 2, for engaging against a sliding surface of a rotating drive rod 24 therein, for stabilizing the element 30 against twisting in a clockwise or counter-clockwise direction as viewed in FIG. 3.

In the application in a preferred situation, the elements 30 are disposed, many in number across the apparatus between front and back walls 13 thereof, and it will be seen that the rails 31 extend over about 2½ spaces between adjacent rods 24,25. If desired, the rails 31 may be disposed such that a next adjacent one in transverse direction will commence with its upstream end 32 just prior to the terminal disposition of a downstream end 33 of a next-previous element, to give a substantially continuous guiding support to elements being conveyed, where desired.

In accordance with the present invention, it will be seen that as many as 200 guide elements 30 or more may be used with a given piece of equipment to provide adequate guiding of material being treated therethrough. At the same time, it will be apparent that when the equipment is desired to be used for treating materials that are not so thin or small as to require the use of guides of some type, the elements 30 may readily be unsnapped or removed, and the equipment is immediately ready for other use.

It will also be apparent, particularly of the illustration of FIG. 3, that the upper surface of the rail 31 will form substantially a line of contact with material being conveyed thereover, in that the rail 31 is preferably of circular cross-section, with the other components, such as the rail 34 and the mounts 35 and 36 being preferably of rectangular cross-section.

The present invention thus allows a high degree of serviceability of the equipment, as well, because of the ready removability of the elements 30.

It will thus be apparent that the desired ends of the invention are satisfied. Other modifications may be made in the details of construction, as well as in the use and operation of the present invention, all within the spirit and scope of the appended claims.

I claim:

1. In processing equipment in which thin materials are being conveyed along a predetermined path of travel from one end of the equipment to the other, with the path being comprised of a plurality of rotatably drivable rods extending transverse of the equipment and serially arranged between ends of the equipment to provide conveyance of materials through the equipment, the improvement comprising a plurality of material guide elements adapted to be carried by said drive rods so as to be free of rotation therewith, with said guide elements each having an upper guide rail disposed substantially parallel with the path of travel, with said rails, when carried by said drive rods, being disposed for engaging thin materials being conveyed through the machine and guiding the materials along their path, and with the guide elements having mounting means for mounting of said elements on the drive rods, wherein said mounting means include opening means facilitating installation and removal of said guide elements transversely of the drive rods without requiring demounting of the drive rods, wherein the mounting means of each guide element includes at least one generally U-shaped opening facing in the general direction of travel of materials through the apparatus, and at least one snap-on, snap-off mounting of the guide element on a drive rod.

2. In processing equipment in which thin materials are being conveyed along a predetermined path of travel from one end of the equipment to the other, with the path being comprised of a plurality of rotatably drivable rods extending transverse of the equipment and serially arranged between ends of the equipment to provide conveyance of materials through the equipment, the improvement comprising a plurality of material guide elements adapted to be carried by said drive rods so as to be free of rotation therewith, with said guide elements each having an upper guide rail disposed substantially parallel with the path of travel, with said rails, when carried by said drive rods, being disposed for engaging thin materials being conveyed through the machine and guiding the materials along their path, and with the guide elements having mounting means for mounting of said elements on the drive rods, wherein said mounting means include opening means facilitating installation and removal of said guide elements transversely of the drive rods without requiring demounting of the drive rods, wherein the guide rails are each connected to and carried by their associated element at an upstream end of the element in its mounted condition, and unconnected to the element at its downstream end in mounted condition.

3. In processing equipment in which thin materials are being conveyed along a predetermined path of travel from one end of the equipment to the other, with the path being comprised of a plurality of rotatably drivable rods extending transverse of the equipment and serially arranged between ends of the equipment to provide conveyance of materials through the equipment, the improvement comprising a plurality of material guide elements adapted to be carried by said drive rods so as to be free of rotation therewith, with said guide elements each having an upper guide rail disposed substantially parallel with the path of travel, with said rails, when carried by said drive rods, being disposed for engaging thin materials being conveyed through the machine and guiding the materials along their path, and with the guide elements having mounting means for mounting of said elements on the drive rods, wherein said mounting means include opening means facilitating installation and removal of said guide elements transversely of the drive rods without requiring demounting of the drive rods, wherein the said guide rails are each of a length to correspond to at least twice the spacing between adjacent rods, wherein the mounting means of each guide element includes means facilitating snap-on, snap-off mounting of the element on at least one guide rod, wherein the mounting means of each said guide element includes at least one generally U-shaped opening sized for receiving a drive rod therein, wherein the mounting means of each said guide element includes at least one generally U-shaped opening facing in the general direction of travel of materials through the apparatus, and wherein the guide rails are each connected to and carried by their associated element at an upstream end of the element in its mounted condition, and unconnected to the element at its downstream end in mounted condition.

4. In processing equipment in which thin materials are being conveyed along a predetermined path of travel from one end of the equipment to the other, with the path being comprised of a plurality of rotatably drivable rods extending transverse of the equipment and serially arranged between ends of the equipment to provide conveyance of materials through the equipment, the improvement comprising a plurality of material guide elements adapted to be carried by said drive rods so as to be free of rotation therewith, with said guide elements each having an upper guide rail disposed substantially parallel with the path of travel, with said rails, when carried by said drive rods, being disposed for engaging thin materials being conveyed through the machine and guiding the materials along their path, and with the guide elements having mounting means for mounting of said elements on the drive rods, wherein said mounting means include opening means facilitating installation and removal of said guide elements transversely of the drive rods without requiring demounting of the drive rods, including stabilizer bar means carried by said guide element and disposed for engagement of each said element with an associated drive rod over a drive rod length that is of greater thickness in the drive rod direction than the associated guide rails, and comprises means for stabilizing the guide element against twisting.

5. The apparatus of any one of claims 1, 2, 3, and 4, wherein drive wheels are rotatably carried on the drive rods for rotation therewith, to define a plane that establishes the path of travel, and wherein the guide rails, when carried by drive rods, are generally located at the plane.

6. The apparatus of any one of claims 1, 2, 3, and 4, wherein the apparatus is of the wet processing type, wherein treatment fluid is applied to the thin materials and wherein the thin materials being treated may become at least partially otherwise directed out of their path of travel, with said guide elements comprising means for maintaining the thin materials in their path of travel through the apparatus.

7. The apparatus of any one of claims 1, 2, 3, and 4, wherein drive wheels are rotatably carried on the drive rods for rotation therewith to define a plane that establishes the path of travel, wherein the guide rails, when carried by drive rods, are generally located at the plane.

* * * * *